US009640592B2

(12) United States Patent
Takata

(10) Patent No.: US 9,640,592 B2
(45) Date of Patent: May 2, 2017

(54) METHOD FOR FORMING FUNCTIONAL LAYER OF ORGANIC LIGHT-EMITTING DEVICE AND METHOD FOR MANUFACTURING ORGANIC LIGHT-EMITTING DEVICE

(71) Applicant: JOLED INC., Tokyo (JP)

(72) Inventor: Masakazu Takata, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/306,610

(22) PCT Filed: Apr. 22, 2015

(86) PCT No.: PCT/JP2015/002178
§ 371 (c)(1),
(2) Date: Oct. 25, 2016

(87) PCT Pub. No.: WO2015/166647
PCT Pub. Date: Nov. 5, 2015

(65) Prior Publication Data
US 2017/0047381 A1    Feb. 16, 2017

(30) Foreign Application Priority Data

Apr. 30, 2014  (JP) ................................ 2014-093447

(51) Int. Cl.
*H01L 21/00*      (2006.01)
*H01L 27/32*      (2006.01)
(Continued)

(52) U.S. Cl.
CPC ............ *H01L 27/3211* (2013.01); *B41J 2/21* (2013.01); *H01L 27/322* (2013.01);
(Continued)

(58) Field of Classification Search
CPC . H01L 27/3211; H01L 51/50; H01L 51/5056; H01L 51/5072; H01L 51/5088;
(Continued)

(56) References Cited

U.S. PATENT DOCUMENTS 8,003,417 B2 * 8/2011 Li ...................... H01L 27/3244
257/98
8,492,184 B2   7/2013 Nishiyama et al.
(Continued)

FOREIGN PATENT DOCUMENTS

JP    2001-291583    10/2001
JP    2004-031070    1/2004
(Continued)

OTHER PUBLICATIONS

U.S. Appl. No. 15/309,232 to Jun Hashimoto et al., filed Nov. 7, 2016.
(Continued)

*Primary Examiner* — Richard Booth
(74) *Attorney, Agent, or Firm* — Greenblum & Bernstein, P.L.C.

(57) ABSTRACT

A method of forming a hole transport layer in which an amount of ink per unit surface area to be applied to a plurality of groove regions is set so as to decrease in an order R, G, B. Prior to applying the ink, a nozzle head is scanned across while applying only solvent to each of the groove regions. At this time, an amount of the solvent to be applied to the groove regions is set so as to increase in the order R, G, B.

8 Claims, 12 Drawing Sheets

(51) Int. Cl.
  *H01L 51/50* (2006.01)
  *H05B 33/10* (2006.01)
  *H05B 33/12* (2006.01)
  *H05B 33/22* (2006.01)
  *B41J 2/21* (2006.01)
  *H01L 51/52* (2006.01)

(52) U.S. Cl.
  CPC .......... *H01L 27/3246* (2013.01); *H01L 51/50* (2013.01); *H01L 51/5056* (2013.01); *H01L 51/5072* (2013.01); *H01L 51/5088* (2013.01); *H01L 51/5284* (2013.01); *H05B 33/10* (2013.01); *H05B 33/12* (2013.01); *H05B 33/22* (2013.01)

(58) Field of Classification Search
  CPC ..... H01L 51/5284; H05B 33/10; H05B 33/12; H05B 33/22
  See application file for complete search history.

(56) References Cited

U.S. PATENT DOCUMENTS

| | | | |
|---|---|---|---|
| 8,492,754 B2 | 7/2013 | Nishiyama et al. | |
| 2007/0200488 A1 | 8/2007 | Ito | |
| 2008/0233669 A1 | 9/2008 | Hirakata et al. | |
| 2010/0213827 A1* | 8/2010 | Yoshida | H01L 27/3246 313/504 |
| 2013/0178004 A1 | 7/2013 | Hirakata et al. | |

FOREIGN PATENT DOCUMENTS

| | | |
|---|---|---|
| JP | 2006-202587 | 8/2006 |
| JP | 2006-212589 | 8/2006 |
| JP | 2006-260779 | 9/2006 |
| JP | 2007-234232 | 9/2007 |
| JP | 2008-186766 | 8/2008 |
| JP | 2008-270182 | 11/2008 |
| JP | 2009-247933 | 10/2009 |
| JP | 2010-161070 | 7/2010 |
| JP | 2013-118095 | 6/2013 |
| JP | 2013-214396 | 10/2013 |

OTHER PUBLICATIONS

U.S. Appl. No. 15/309,238 to Jun Hashimoto et al., filed Nov. 7, 2016.

International Search Report (ISR) from International Searching Authority (Japan Patent Office) in International Pat. Appl. No. PCT/JP2015/002178, dated Jul. 14, 2015.

* cited by examiner

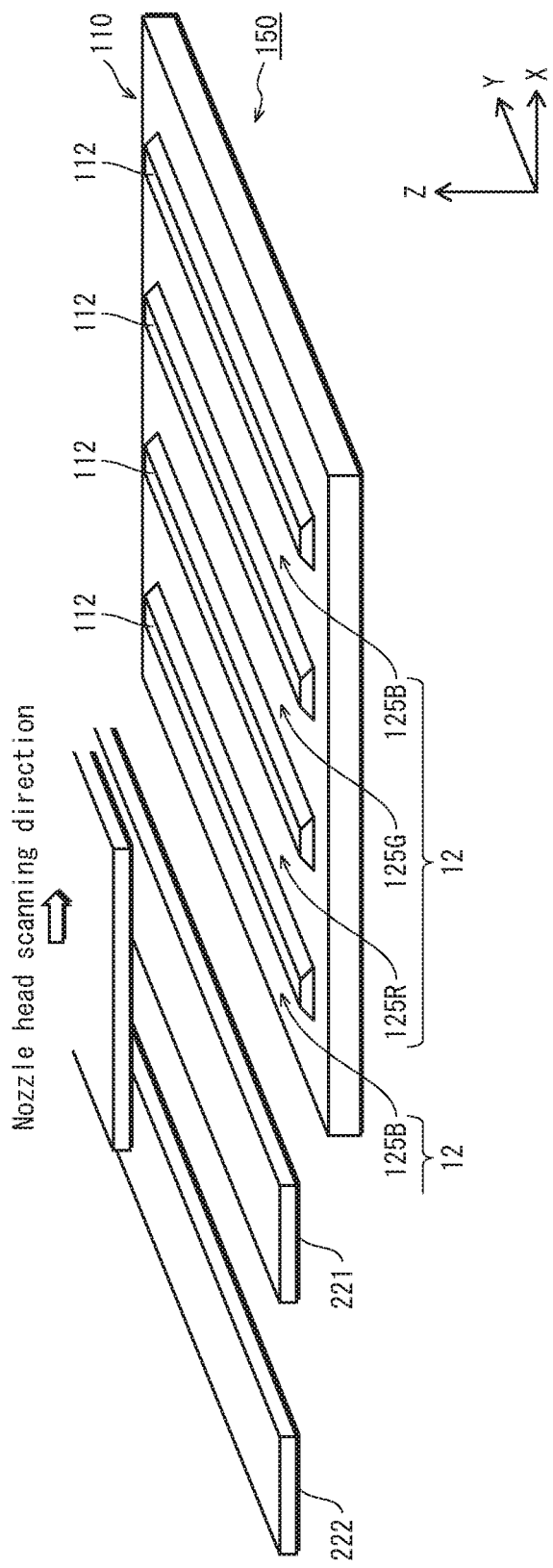

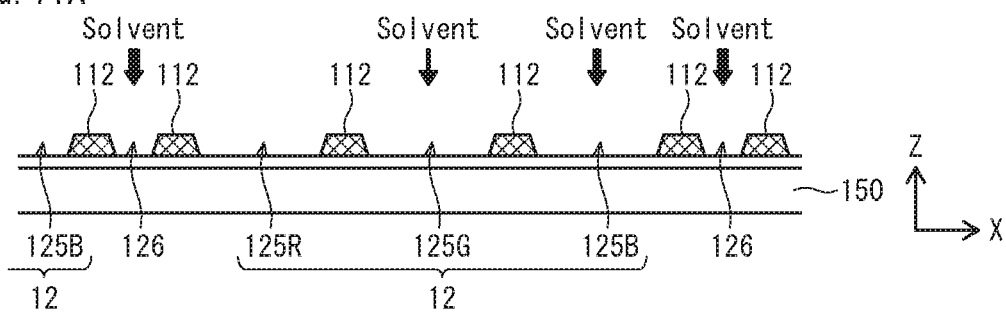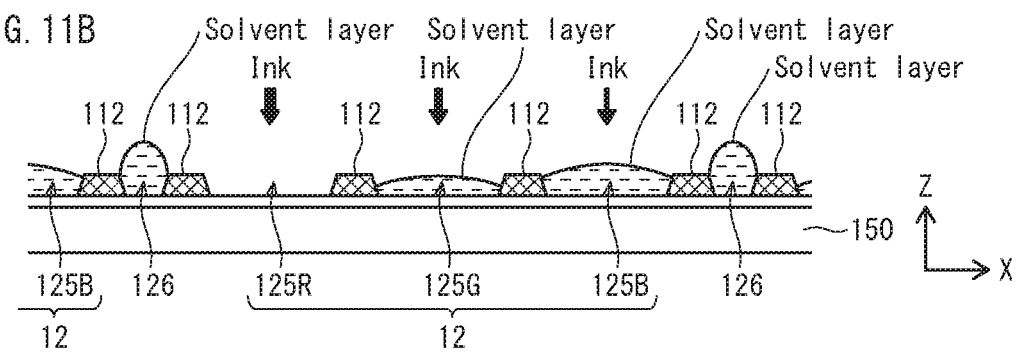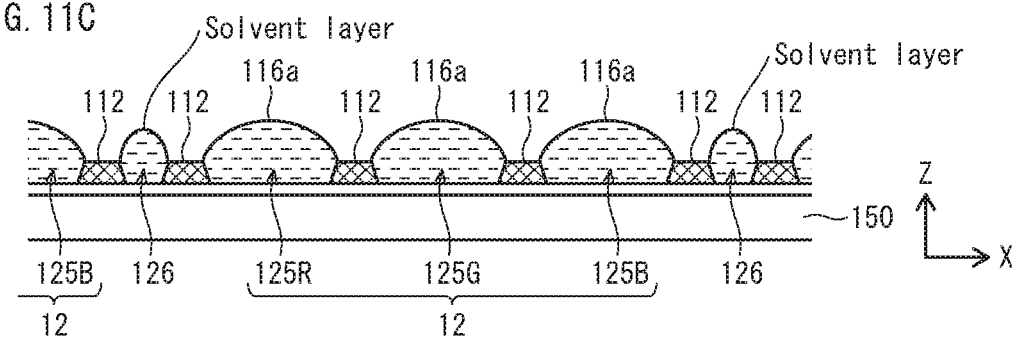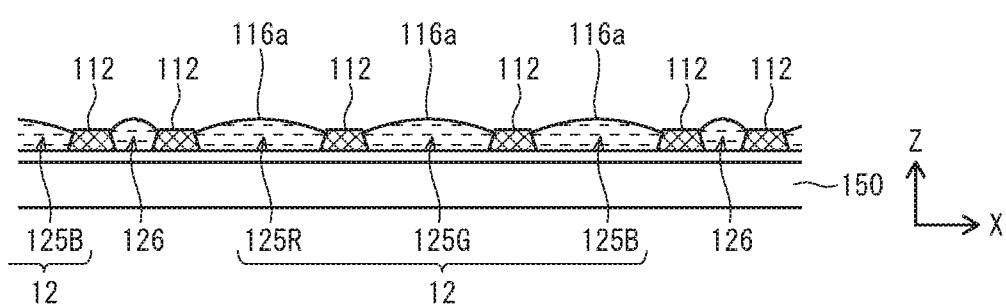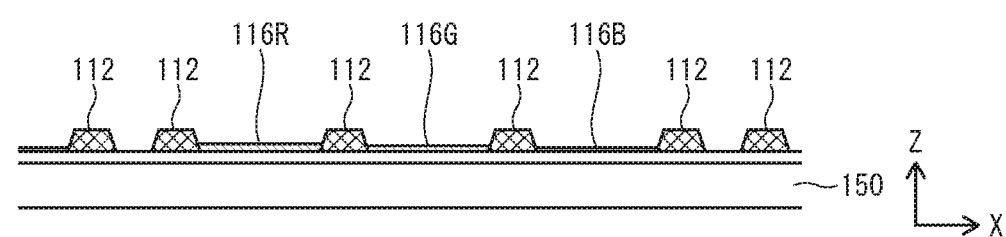

METHOD FOR FORMING FUNCTIONAL LAYER OF ORGANIC LIGHT-EMITTING DEVICE AND METHOD FOR MANUFACTURING ORGANIC LIGHT-EMITTING DEVICE

TECHNICAL FIELD

The present invention pertains to a method of forming functional layers in an organic light emitting device, and particularly pertains to a method of forming the functional layers by applying ink in regions defined by banks.

BACKGROUND ART

In recent years, organic EL devices have been put to practical use as light emitting display devices in which a plurality of organic EL elements are arranged in a column direction and a row direction in a matrix on a substrate. In such organic EL devices, the organic EL elements are self-luminous, therefore having high visibility, and are entirely solid-state, therefore having excellent impact resistance.

In an organic EL device, each organic EL element typically has a structure in which a light emitting layer that includes an organic light emitting material is disposed between an anode and cathode pair of electrodes. When driven, voltage is applied between the pair of electrodes, holes are injected into the light emitting layer from the anode, electrons are injected into the light emitting layer from the cathode, and the holes and the electrons recombine to emit light. In an organic EL device of a full-color display, such organic EL elements form RGB sub-pixels, a single pixel being formed from a combination of neighboring RGB sub-pixels.

In the organic EL device, a light emitting layer of an organic EL element is typically separated from light emitting layers of neighboring organic EL elements by banks composed of an insulating material. Further, a hole injection layer, a hole transport layer, or a hole injection and transport layer are interposed between the anode and the light emitting layer, as required, and an electron injection layer, an electron transport layer, or an electron injection and transport layer are interposed between the cathode and the light emitting layer, as required. Layers such as a hole injection layer, a hole transport layer, a hole injection and transport layer, an electron injection layer, an electron transport layer, and an electron injection and transport layer are generically referred to as functional layers.

When manufacturing such an organic EL device, there is a process of forming a plurality of banks extending in one direction over a substrate, and forming a functional layer in each of a plurality of groove regions defined by the banks, as indicated in Patent Literature 1. Ink for forming the light emitting layer, including macromolecular material and small molecules with good thin-film formation properties, is often used in a wet process of applying to concave spaces using a method, such as an inkjet method, when forming the functional layer. According to such a wet process, the light emitting layer may be formed with comparative ease despite the panel being large.

As it happens, in certain situations, an amount of the ink applied to each of the groove regions differs among the groove regions defined by the banks because the functional layer is formed for red, green, and blue sub-pixels.

For example, a set film thickness for the hole transport layer and the light emitting layer may differ among red light emitting elements, green light emitting elements, and blue light emitting elements, and the amount of ink applied to the respective groove regions may also differ.

CITATION LIST

Patent Literature 1

Japanese Patent Application Publication No. 2007-234232

SUMMARY OF INVENTION

Technical Problem

As described above, in the process of forming the functional layer with a wet process, differences in the amount of applied ink among neighboring groove regions in which sub-pixels of different colors making up pixels are formed may lead to bias in drying speed among locations within each of the groove regions during drying. As a result, the functional layer formed in the groove regions may be formed with bias in terms of film thickness distribution.

Also, once the film thickness distribution of the functional layer in each of the groove regions has been formed with bias, then when the organic EL device is driven, greater current density flow occurs at locations within the groove regions where the film thickness is small, which is a cause of degradation.

The present invention aims to homogenize the film thickness distribution of the functional layer formed in each of the groove regions, even in situations where the amount of applied ink differs among neighboring groove regions in which sub-pixels of different colors configuring the pixels are formed, when forming the functional layer by applying ink in the groove regions defined by the banks.

Solution to Problem

A method of forming a functional layer pertaining to one aspect of the present invention is a method of forming a functional layer of an organic light-emitting device in which a plurality of pixels are disposed, each including a plurality of sub-pixels of different colors arranged next to one another, by a process including: preparing a bank substrate including a base substrate and a plurality of banks extending in one direction, parallel to each other, along a surface of the base substrate; applying ink to each of a plurality of groove regions between adjacent ones of the banks; and drying the ink after application, the method comprising: defining a plurality of groove region groups on the bank substrate, each including a plurality of groove regions arranged next to one another for sub-pixels of different colors; for each of the groove region groups, setting an amount of the ink per unit surface area applied to a subset of groove regions to be smaller than an amount of the ink per unit surface area applied to remaining groove regions in the groove region group; before or after applying the ink to the groove regions, applying a solvent able to dissolve the ink to the subset of the groove regions, and either not applying the solvent or applying the solvent in a smaller amount per unit surface area than in the subset of the groove regions to the remaining groove regions; and drying ink layers formed in the groove regions by the application of the ink and the solvent.

Here, "unit surface area" indicates a unit surface area of an aperture in a groove region.

Advantageous Effects of Invention

According to the method of forming the functional layer of the above-described aspect, a subset of the groove regions among the groove regions in the groove region group are configured to have an amount of ink applied per unit surface area that is smaller in comparison to remaining groove regions. Also, an amount of solvent applied per unit surface area in the subset of the groove regions, in which the amount of ink applied per unit surface area is smaller, is configured to be greater than an amount of solvent applied per unit surface area in the remaining groove regions. As such, combined amounts of the ink and the solvent applied per unit surface area, and the surface area of the ink layers, are homogenized between the subset of the groove regions and the remaining groove regions.

Accordingly, the surface area (surface area of the ink layers per unit surface area of the groove regions) of the ink layers made up of the ink and the solvent applied to the groove regions included in each of the groove region groups is homogenized, irrespective of differences in the amount of ink applied per unit surface area in the subset of the groove regions and the remaining groove regions. As a result, the occurrence of uneven solvent vapor pressure distribution over the groove regions is suppressed during drying. Time required for drying the ink layers formed in the groove regions making up each of the groove region groups is also homogenized.

Accordingly, bias in film thickness distribution may be eliminated in the functional layer formed in each of the groove regions.

Eliminating bias in film thickness distribution of the functional layer in each of the light emitting elements provides long usable life as the distribution of current density within the light emitting elements is also homogeneous. In addition, discrepancies in brightness are unlikely to occur among the light emitting elements.

BRIEF DESCRIPTION OF DRAWINGS

FIG. 5 is a schematic perspective view diagram of a bank substrate 150.

FIGS. 11A to 11E are diagrams indicating a manufacturing process for a hole transport layer 116 pertaining to Embodiment 2, FIG. 11A indicating a process of applying a solvent, FIG. 11B indicating a process of applying ink, FIG. 11C indicating a process of forming ink layers, FIG. 11D indicating a process of drying the ink layers, and FIG. 11E indicating the status after hole transport layer completion.

DESCRIPTION OF EMBODIMENTS

Background Leading to the Invention

Figure 1:
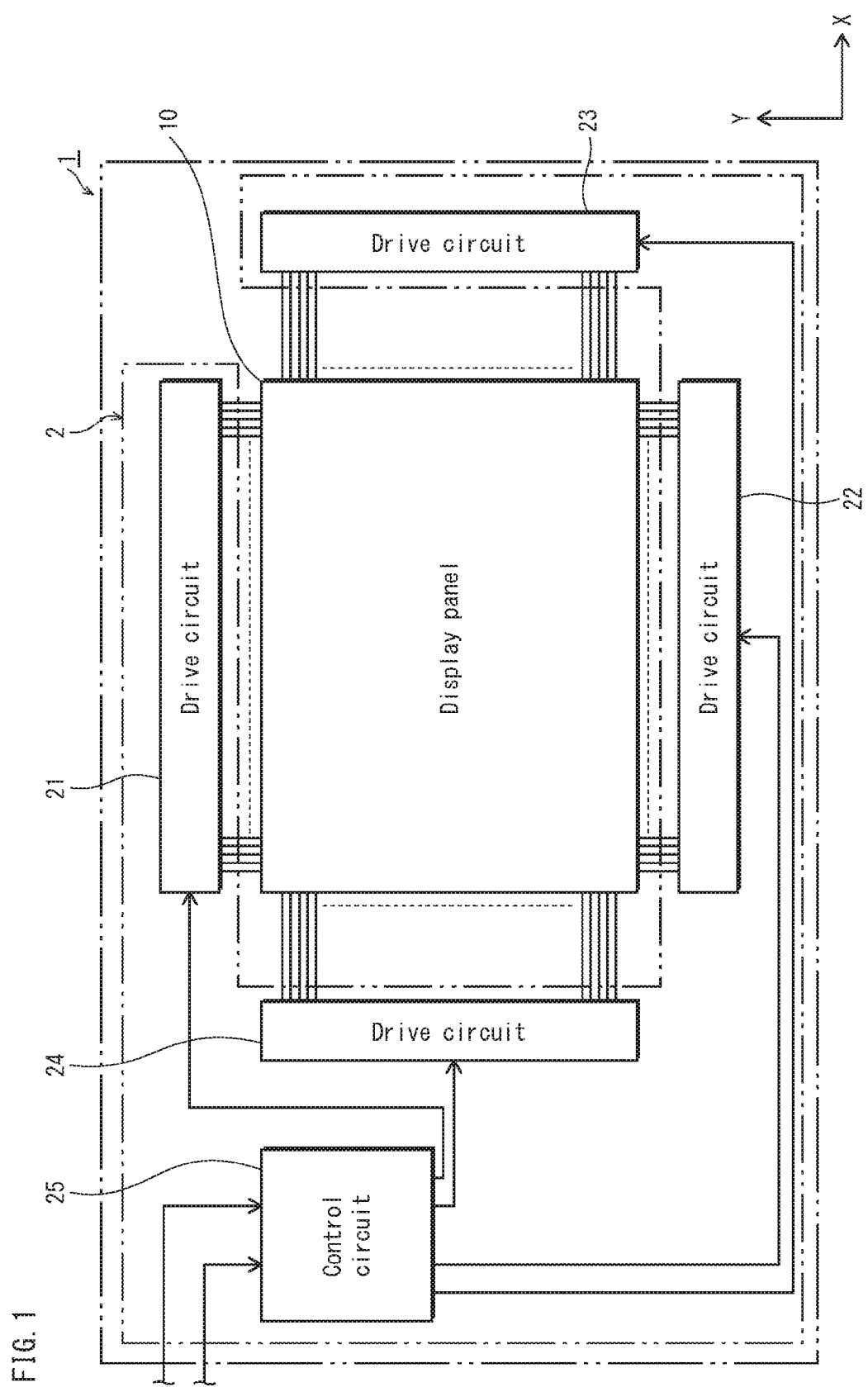
FIG. 1 is a schematic block diagram indicating the overall configuration of an organic EL display device 1 pertaining to Embodiment 1.

The inventor has investigated manufacturing of an organic light emitting device in which sub-pixels are formed in each of a plurality of groove regions defined by a plurality of banks along a surface of a base substrate. As a result of this investigation, the inventor has discovered that bias in film thickness distribution occurs in a functional layer formed in each of the groove regions when the functional layer is formed by applying ink to each of the groove regions during manufacturing of the organic light emitting device and an amount of ink applied to each of the groove regions differs.

This phenomenon is thought to be caused by differences in evaporation speed of solvent in each of the groove regions during a drying process, occurring when the amount of ink applied differs among the groove regions. One of the ink layers in one of the groove regions between other groove regions having different evaporation speeds is thought to undergo ink flow toward one of the groove regions with lower evaporation speed due to the coffee stain effect.

Also, bias in ink layer shape after drying is thought to occur due to displacement of functional material within the ink layers accompanying the ink flow.

A method of eliminating bias in film thickness of the functional layer formed in each of the groove regions has been considered, based on these discoveries, by homogenizing the drying of the ink layers between the groove regions as much as possible among the groove region groups in which neighboring groove regions are formed with sub pixels of different respective colors.

Drying of the ink layers may be homogenized provided that respective amounts of ink applied per unit surface area in the groove regions are configured equally. Nevertheless, when a common ink is applied to the groove regions, and when each of the groove regions is configured with different layer thickness, the amount of ink applied must be set individually, and identical amounts of applied ink are not usable.

The inventor has considered a method of homogenizing the evaporation speed of ink layers despite differences in the amount of ink applied to the groove regions, and has arrived at the present invention.

Aspect of Invention

A method of forming a functional layer pertaining to one aspect of the present invention is a method of forming a functional layer of an organic light-emitting device in which a plurality of pixels are disposed, each including a plurality of sub-pixels of different colors arranged next to one another, by a process including: preparing a bank substrate including a base substrate and a plurality of banks extending in one direction, parallel to each other, along a surface of the base substrate; applying ink to each of a plurality of groove regions between adjacent ones of the banks; and drying the ink after application, the method comprising: defining a plurality of groove region groups on the bank substrate, each including a plurality of groove regions arranged next to one another for sub-pixels of different colors; for each of the groove region groups, setting an amount of the ink per unit surface area applied to a subset of groove regions to be smaller than an amount of the ink per unit surface area applied to remaining groove regions in the groove region group; before or after applying the ink to the groove regions, applying a solvent able to dissolve the ink to the subset of the groove regions, and either not applying the solvent or applying the solvent in a smaller amount per unit surface area than in the subset of the groove regions to the remaining groove regions; and drying ink layers formed in the groove regions by the application of the ink and the solvent.

According to the method of forming the functional layer, a subset of the groove regions, among the groove regions in each of the groove region groups, are configured to have an amount of ink applied per unit surface area that is smaller in comparison to remaining groove regions. Also, an amount of solvent applied per unit surface area in the subset of the groove regions in which the amount of ink applied per unit surface area is smaller, is configured to be greater than an amount of solvent applied per unit surface area in the remaining groove regions. As such, the total amount of ink and solvent applied per unit surface area is homogenized among the subset of the groove regions and the remaining groove regions.

Accordingly, the total amount of ink and solvent making up the ink layers applied to the groove regions making up each of the groove region groups is homogenized, and the surface area of the ink layers per unit surface area of the groove regions is also homogenized, irrespective of differences in the amount of ink applied per unit surface area among the subset of the groove regions and the remaining groove regions. As such, the occurrence of uneven solvent vapor pressure distribution over the groove regions is suppressed during drying. Time required for drying the ink layers formed in the groove regions making up each of the groove region groups is also homogenized.

Accordingly, bias in film thickness distribution may be suppressed in the functional layer formed in each of the groove regions.

The method of forming the functional layer of the above-described aspect may also be as follows.

An amount of the solvent applied to each of the groove regions is configured so that a surface area of the ink layer formed per unit surface area of the groove regions is equal.

A gap where a busbar is to be disposed is located between neighboring groove regions groups among the groove region groups on the base substrate, and during the application of the solvent, the solvent is also applied to the gap where the busbar is to be disposed. This results in a beneficial effect of homogenizing film thickness distribution of the functional layer formed in each of the groove regions.

Among the groove region groups, setting an average amount of the solvent applied per unit surface area to one of the groove region groups positioned at a peripheral portion of the base substrate to be greater than an average amount of the solvent applied per unit surface area to one of the groove region groups positioned at a central portion of the base substrate.

In comparison to the groove region group in the central portion of the base substrate, the groove region group in the peripheral portion is likely to have greater solvent evaporation speed. However, the time until drying of the ink layers is complete may be matched between the central portion and the peripheral portion by setting the average amount of solvent applied per unit surface area in the groove region groups positioned at the peripheral portion to be greater than the average amount of solvent applied per unit surface area in the groove region groups positioned at the central portion of the base substrate. Adding this configuration also imparts homogeneity to the film thickness distribution of the functional layer formed uniformly within each of the groove regions.

The application of the solvent is preferentially performed before the application of the ink in each of the groove regions.

When the ink is applied to the groove regions first, there is a possibility that drying of the ink may progress before the solvent is applied and prevent effective mixing with the solvent. However, this is not the case when the solvent is applied before the ink, as the ink and the solvent applied to the groove regions are well mixed.

The solvent preferentially includes a component shared with a solvent contained in the ink. This has the effects of improving solubility of the solvent and the ink with each other and improves uniformity of evaporation rates from the ink layers between the groove regions.

A method of manufacturing an organic light-emitting device pertaining to an aspect of the present invention uses the method of forming the functional layer described above on the base substrate.

A device for manufacturing an organic light-emitting device pertaining to an aspect of the present invention is a device for manufacturing the organic light-emitting device including a bank substrate including: a base substrate and a plurality of banks extending in one direction, parallel to each other, along a surface of the base substrate, a plurality of groove regions each being located between adjacent ones of the banks and a plurality of groove regions groups being present, each including a plurality of groove regions arranged next to one another and sub-pixels of different colors, the device comprising: a first inkjet head that discharges first liquid drops composed of an ink; a second inkjet head that discharges second liquid drops composed of a solvent able to dissolve the ink; and a control unit that makes the first inkjet head discharge the first liquid drops into a subset of the groove regions in each of the groove region groups so an amount of ink applied per unit surface area is small in comparison to remaining groove regions, makes the second inkjet head discharge the second liquid drops into the subset of the groove regions, and performs one of: not making the second inkjet head discharge the second liquid drops to the remaining groove regions; and making the second inkjet head discharge the second liquid drops in a smaller amount applied per unit area than the amount applied per surface area to the subset of the groove regions.

Embodiment 1

The following describes a configuration and method of manufacture of an organic EL device pertaining to an embodiment.

1. Overall Configuration of Device

Figure 2:
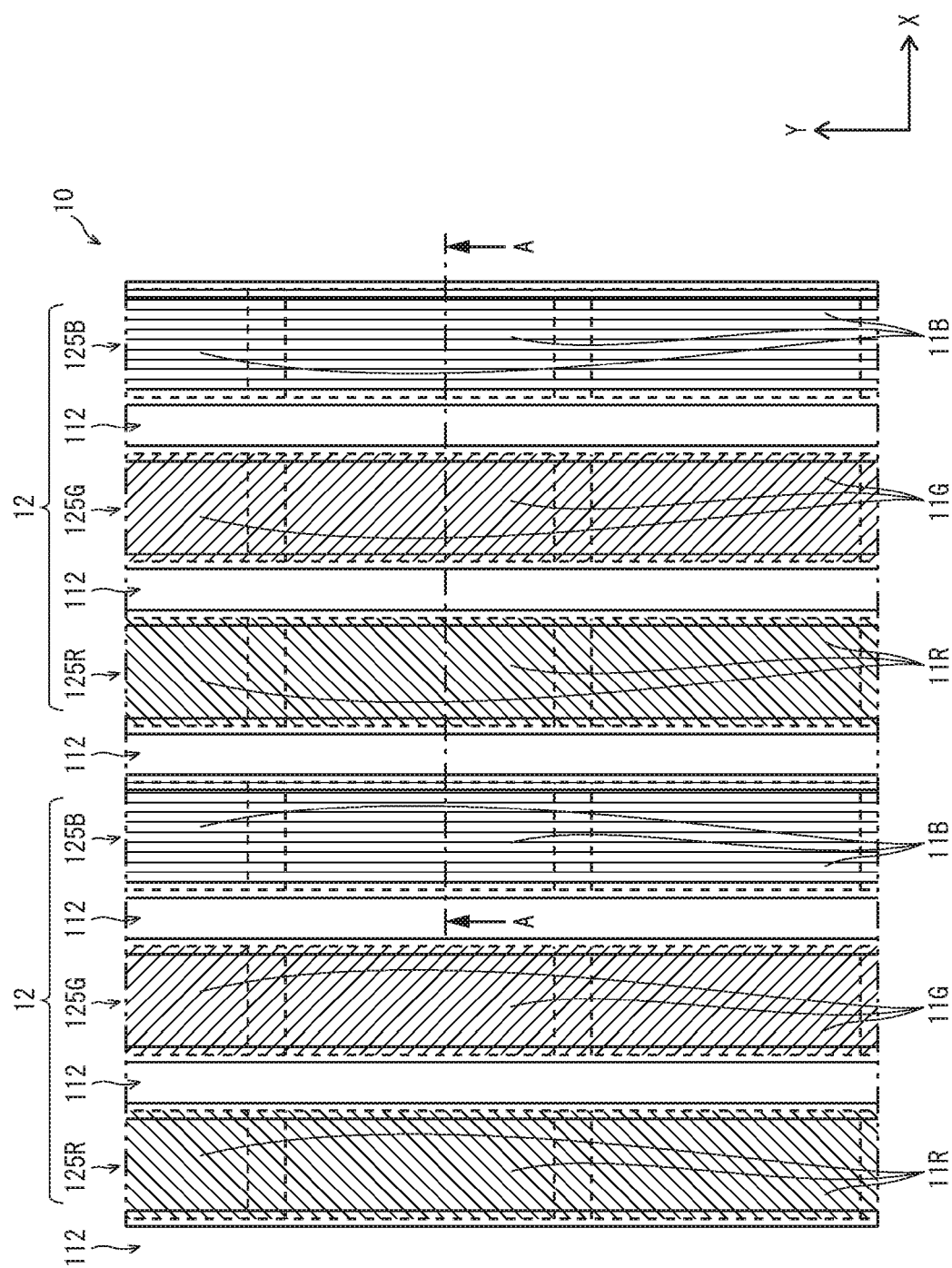
FIG. 2 is a schematic plan view diagram indicating an arrangement of light emitting elements 11a, 11b, and 11c in a display panel 10.

Referring to FIG. 1 and FIG. 2, the overall configuration of an organic EL display device 1 is described.

As shown in FIG. 1, the organic EL display device 1 includes a display panel 10 and a drive control circuit 2 connected thereto. The display panel 10 is a type of organic light emitting device, and is an organic EL panel that uses electroluminescence of an organic material. The drive control circuit 2 of the organic light emitting device 1 is configured from four drive circuits 21, 22, 23, and 24, and a control circuit 25.

FIG. 2 is a plan view diagram of the display panel 10. In the display panel 10, a plurality of light emitting elements 11R, 11G, and 11B are arranged two-dimensionally along an X direction and a Y direction. In the display panel 10, the light emitting elements 11R emit red light (R), the light emitting elements 11G emit green light (G), and the light emitting elements 11B emit blue light (B).

Also, the light emitting elements 11R, 11G, and 11B respectively correspond to red sub-pixels, green sub-pixels, and blue sub-pixels, one pixel being configured by three of the light emitting elements 11R, 11G, and 11B neighboring each other in the X direction. In other words, each pixel is made up of one of the red sub-pixels, one of the green sub-pixels, and one of the blue sub-pixels neighboring in the X direction. The length of each sub-pixel in the Y direction is, for example, 300 μm.

2. Configuration of Display Panel 10

In the display panel 10, groove regions 125R, 125G, and 125B are formed, being defined by a plurality of banks 112 extending in the Y direction. The groove regions 125R, 125G, and 125B are groove regions for red, for green, and for blue, in which the light emitting elements 11R, 11G, and 11B emitting light of each corresponding color are arranged in the Y direction.

The banks 112 are formed over a base substrate 110, as indicated in FIG. 5.

Returning to FIG. 2, one groove region group 12 is configured by three of the groove regions 125R, 125G, and 125B neighboring each other, each having a respective one of the red sub-pixels, the green sub-pixels, and the blue sub-pixels formed therein in the colors forming each of the pixels.

Thus, a plurality of the groove region groups 12 are formed on the display panel 10 as a whole, and are aligned in the X direction.

Figure 3:
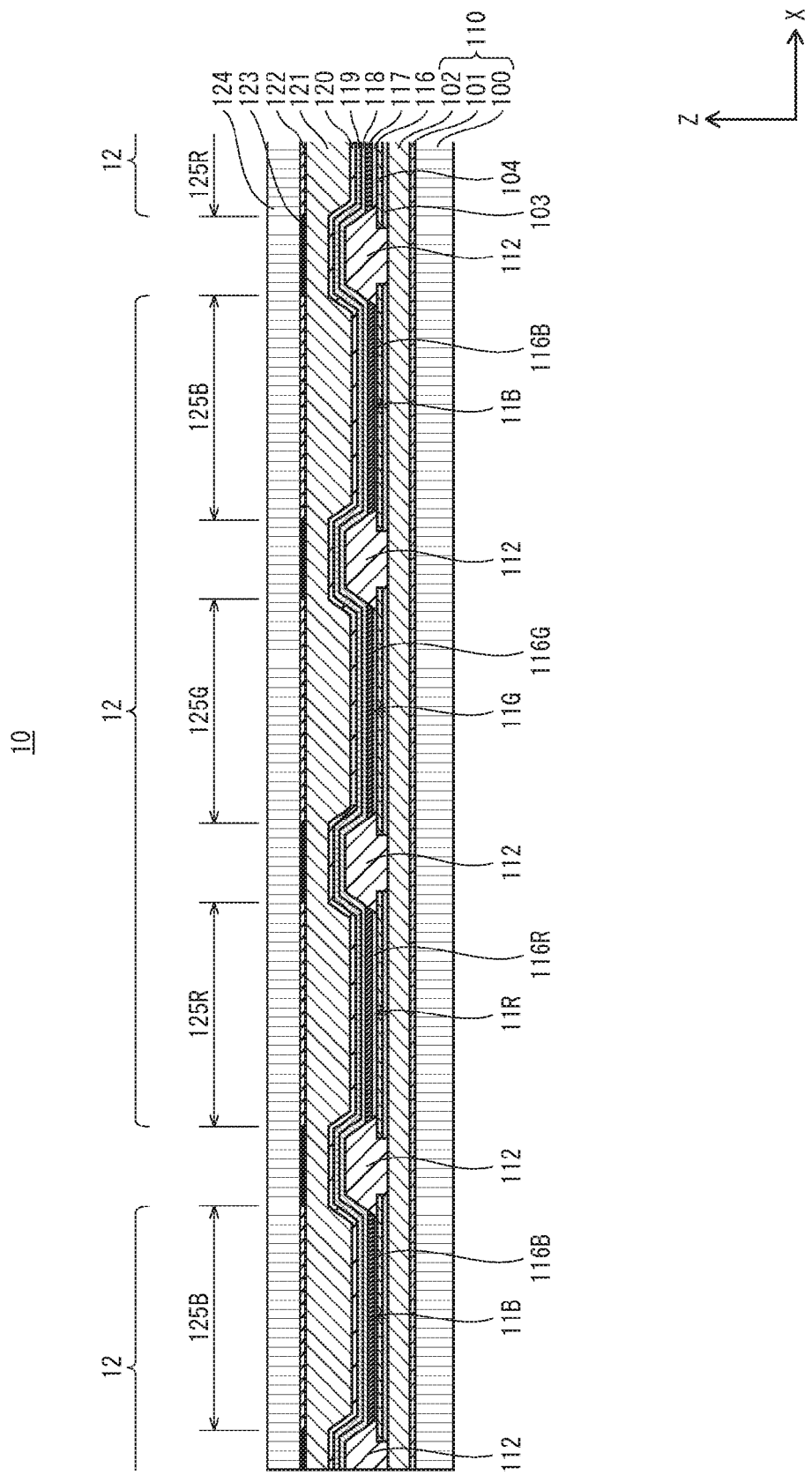
FIG. 3 is a schematic cross-sectional diagram indicating a cross-section along A-A in FIG. 2.

FIG. 3 is a schematic cross-sectional view taken along line A-A in FIG. 2.

The display panel 10 has a TFT substrate serving as a base and including a substrate 100 and a TFT layer 101 formed on the substrate 100. The TFT layer 101 includes three electrodes, namely a gate, a source, and a drain, a semiconductor layer, and a passivation film, which are not illustrated in the drawings.

The base substrate 110 is formed by an inter-layer insulation layer 102 being stacked on the TFT substrate. The inter-layer insulation layer 102 has a top face formed to be substantially planar, the light emitting elements 11R, 11G, and 11B being formed thereon.

The basic configuration of the light emitting elements 11R, 11G, and 11B is identical, each being configured from a pixel electrode 103, a hole injection layer 104, a hole transport layer 116, a light emitting layer 117, an electron transport layer 118, and a cathode 119 being formed in a stack on the inter-layer insulation layer 102, in the stated order.

The banks 112 are formed over the inter-layer insulation layer 102 so as to cover both edges of the hole injection layer 104 in the X direction.

The hole transport layer 116, the light emitting layer 117, and the electron transport layer 118 are then formed as a stack between the banks 112.

Here, the hole transport layer 116, the light emitting layer 117, and the electron transport layer 118 are formed so as to be continuous in the Y direction.

Here, the optical film thickness of the hole transport layer 116 is configured such that resonator structures are formed in each of the light emitting elements 11. As such, the film thickness of the hole transport layer 116 differs between the red light emitting elements 11R, the green light emitting elements 11G, and the blue light emitting elements 11B in accordance with the wavelength of light in each emitted color. Specifically, the film thickness of the hole transport layer 116 is greatest in a hole transport layer 116R for red, is smaller in a hole transport layer 116G for green, and is smallest in a hole transport layer 116B for blue.

Also, the cathode 119 and a sealing layer 120 are formed in the stated order so as to entirely cover the top of the electron transport layer 118 and side faces and peak faces of the banks 112.

The sealing layer 120 has a function of preventing organic layers, such as the light emitting layer 117, from being exposed to water or exposed to air.

A substrate 124 having a black matrix layer 122 and a color filter layer 123 is stacked on the sealing layer 120 with a resin layer 121 interposed between the substrate 124 and the sealing layer 120.

The display panel 10 having the above configuration is of a top-emission type and emits light in a Z direction.

The pixel electrode 103 is an electrode provided independently for each of the light emitting elements 11R, 11G, and 11B over the inter-layer insulation layer 102, and is connected to an upper electrode (an electrode connected to one of source and drain) of the TFT layer 101 through contact holes (not depicted) provided in the inter-layer insulation layer 102.

3. Component Materials of Display Panel 10

Substrate 100:

The substrate 100 is formed by using, for example, a glass substrate, a silica glass substrate, a metal substrate such as molybdenum sulfide, copper, zinc, aluminium, stainless steel, magnesium, iron, nickel, gold, or silver, a semiconductor substrate based on gallium arsenide, or a plastic substrate.

As a plastic substrate, any thermoplastic or thermosetting resin may be used.

For example, the plastic substrate may be a polyolefin such as polyethylene, polypropylene, ethylene-propylene copolymer, ethylene-vinyl acetate copolymer (EVA), etc., cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, acryl-styrene copolymer (AS resin), butadiene-styrene copolymer, ethylene vinyl alcohol (EVOH) copolymer, polyethelene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, another fluorine-based resin, various thermoplastic elastomers such as styrene-based, polyolefin-based, polyvinyl chloride-based, polyurethane-based, or fluororubber-based thermoplastic elastomers, epoxy resin, phenolic resin, urea resin, melamine resin, unsaturated polyester, silicone resin, polyurethane, etc., or a copolymer, blend, polymer alloy, etc., that primarily comprises one of the above. Further, a layered body may be used in which one or more of the materials above may be used in one or more layers.

Inter-Layer Insulating Layer 102:

In manufacturing the display panel 10, an etching process, a baking process, etc., are implemented, and therefore the inter-layer insulating layer 102 is preferably formed from a material that is resistant to such processes. The inter-layer insulating layer 102 is, for example, formed from an organic compound such as polyimide, polyamide, or acrylic resin.

Pixel Electrode 103:

The display panel 10 is a top-emission type, and therefore a surface of the pixel electrode 103 preferably has high reflectivity. The pixel electrode is formed from a metal material including silver (Ag) or aluminium (Al).

The pixel electrode 103 can be a layered body including a metal layer and an optically transmissive electrically-conductive layer instead of a single layer structure made from a metal material. As the optically transmissive electrically-conductive layer, indium tin oxide (ITO) or indium zinc oxide (IZO) may be used, for example.

Hole Injection Layer 104:

The hole injection layer 104 is formed from an oxide of a metal such as silver (Ag), molybdenum (Mo), chromium (Cr), vanadium (V), tungsten (W), nickel (Ni), or iridium (Ir), or an electrically conductive polymer such as poly(3,4-ethylenedioxythiophene) polystyrene sulfonate (PEDOT:PSS).

Banks 112:

The banks 112 are formed from an organic material having photosensitivity. Examples of the organic material include, for example, acrylic resin, polyimide resin, siloxane resin, and phenol resin.

Fluorine resin is preferentially used given that liquid-repellency with respect to the ink used in forming layers such as the hole transport layer 116 and the light emitting layer 117 is beneficial in a wet process.

The structure of the banks 112 is not limited to a mono-layer structure, and may be a multi-layer structure of two or more layers. When a multi-layer structure is used, a combination of the above-listed materials may be used in each layer.

Hole Transport Layer 116:

The hole transport layer 116 may be formed by using, for example, a macromolecular compound such as polyfluorene, a derivative thereof, polyarylamine, or a derivative thereof.

Light Emitting Layer 117:

As a material of the light emitting layer 117, a phosphorescent material is used, such as polyphenylene vinylene (PPV), polyfluorene, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or a rare earth complex.

Electron Transport Layer 118:

The electron transport layer 118 is formed using, for example, an oxadiazole derivative (OXD), a triazole derivative (TAZ), or a phenanthroline derivative (BCP, Bphen).

Cathode 119:

The display panel 10 is a top-emission type, and therefore the cathode 119 is formed from an optically transmissive material. Specific examples of material include indium tin oxide (ITO) and indium zinc oxide (IZO).

Sealing Layer 120:

The sealing layer 120 is formed from an optically transmissive material.

Material of the sealing layer 120 is, for example, silicon nitride (SiN) or silicon oxynitride (SiON). Further, on a layer formed from a material such as silicon nitride (SiN) or silicon oxynitride (SiON), a sealing resin layer composed of resin material such as acrylic resin or silicone resin may be provided.

Resin Layer 121:

The resin layer 121 is formed from an optically transmissive resin material such an epoxy resin material. However, an alternative material may be used such as silicone resin.

Black Matrix Layer 122:

The black matrix layer 122 is formed from a UV curable resin material that includes black pigment that has excellent light absorption and light-shielding properties. As an UV curable resin material, an acrylic-type of ultraviolet curing resin material is used.

Color Filter Layer 123

The color filter layer 123 is formed from a material that selectively transmits visible light in a wavelength range of each of red (R), green (G), and blue (B) colors; for example, a material based on a known acrylic resin.

Substrate 124:

The substrate 124 is formed similarly to the substrate 100 by using, for example, a glass substrate, a silica glass substrate, a metal substrate such as molybdenum sulfide, copper, zinc, aluminium, stainless steel, magnesium, iron, nickel, gold, or silver, a semiconductor substrate based on gallium arsenide, or a plastic substrate.

4. Method of Manufacturing the Display Panel 10

Figure 4:
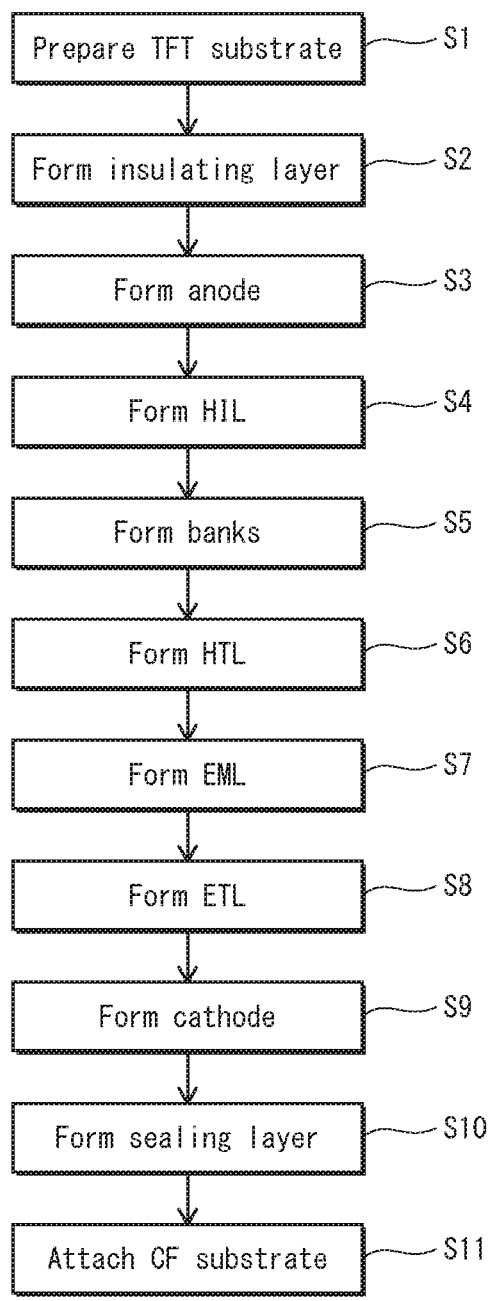
FIG. 4 is a process diagram indicating a manufacturing process of the display panel 10.

A method of manufacturing the display panel 10 is described with reference to the process diagram of FIG. 4.

When manufacturing the display panel 10, first, the TFT substrate is prepared (step S1). The TFT substrate is manufactured by forming the TFT layer 101 on the upper surface of the substrate 100, using a publicly known technique.

Subsequently, the inter-layer insulating layer 102 is formed by applying the organic material on the TFT substrate (step S2).

The pixel electrode 103 and the hole injection layer 104 are formed as a stack in the stated order over the inter-layer insulation layer of the base substrate 110 so created (steps S3, S4). The pixel electrode 103 is formed by, for example, forming a metallic film using one of a sputtering method and a vacuum deposition method, and subsequently patterning using a photolithography method and an etching method.

The hole injection layer 104 is formed such that a film is formed of metal oxide (such as tungsten oxide) by a sputtering method and then patterned by a photolithography method and an etching method.

Next, a bank substrate 150 is manufactured by forming the banks 112 (step S5).

The banks 112 are formed by uniformly applying a bank material (a negative photosensitive resin composition) over a substrate. A photo mask having apertures suitable for a pattern of the banks 112 is overlaid on an applied layer of the bank material, and light exposure is performed from above the photo mask. Afterwards, any excess bank material is washed away with an alkali developing fluid, and the bank material is patterned, thus forming the banks 112.

As indicated in FIG. 5, the groove regions 125R, 125G, and 125B are formed on the top face side of the bank substrate 150, being defined by the banks 112 extending in the Y direction.

The banks 112 have height (height from the surface, where the banks 112 on the inter-layer insulation layer 102 are formed over the base substrate 110 as indicated in FIG. 5) of 1 µm and width of 30 µm, for example. Here, as discussed above, the banks 112 are formed over the base substrate 110. As such, the height of the banks 112 is height from the top face of the base substrate 110 to the top face of the banks 112.

Returning to FIG. 4, the hole transport layer 116 is formed in each of the groove regions 125 defined by the banks 112 (step S6). The formation of the hole transport layer 116 is described in detail later, and involves using a wet process, applying ink containing structural material for the hole transport layer 116 in the groove regions between the banks 112, and subsequently drying.

Similarly, the light emitting layer 117 is formed as a stack in the groove regions defined by the banks 112 (step S7). The light emitting layer 117 is also formed by applying ink containing structural material, and subsequently drying.

Next, the electron transport layer 118, the cathode 119, and the sealing layer 120 are formed and stacked in the stated order, so as to cover the light emitting layer 117 and the peak faces of the banks 112 (steps S8, S9, and S10). The electron transport layer 118, the cathode 119, and the sealing layer 120 may be formed, for example, by using a sputtering method.

Afterwards, a color filter substrate, in which a color filter layer 123 and a black matrix layer 122 are formed on the substrate 124, is joined thereto, thereby completing the display panel 10 (step S11).

5. Formation Process of Hole Transport Layer 116

FIGS. 6A to 6E are schematic cross-sectional diagrams indicating a process of forming the hole transport layer in the groove regions 125R, 125G, and 125B.

Figure 6A:
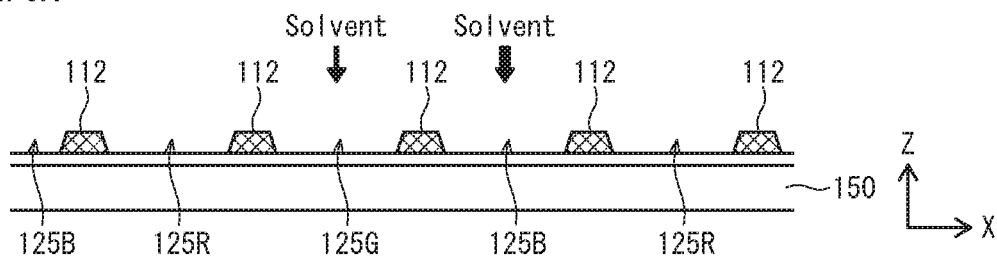
FIGS. 6A to 6E depict a manufacturing process of a hole transport layer 116 pertaining to Embodiment 1, FIG. 6A indicating a process of applying a solvent, FIG. 6B indicating a process of applying ink, FIG. 6C indicating a process of forming ink layers, FIG. 6D indicating a process of drying the ink layers, and FIG. 6E indicating the status after hole transport layer completion.
Figure 6B:
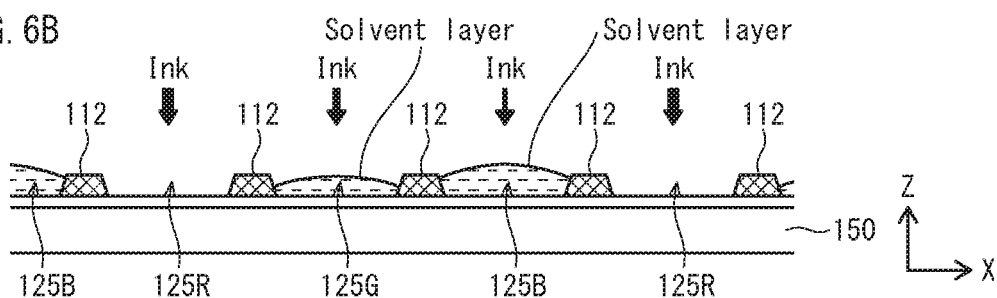

As indicated in FIG. 6B, the ink for forming the hole transport layer is applied to the groove regions 125R, 125G, and 125B on the bank substrate 150. However, before the process of applying the ink, a process of applying a solvent to the groove regions 125G and 125B is performed as indicated in FIG. 6A.

FIG. 5 indicates nozzle heads 221 and 222 in an application device. Nozzle head 221 is for solvent application and nozzle head 222 is for ink application. A plurality of nozzles (not depicted) are aligned in the Y direction on a bottom face side of each of the nozzle heads 221 and 222.

These nozzle heads 221 and 222 scan across the bank substrate 150 and discharge one of the solvent and the ink. This enables one of the solvent and the ink to be applied to each of the groove regions 125R, 125G, and 125B.

The ink applied during ink application in FIG. 6B is a solution in which material for the hole transport layer 116 is dissolved into a predetermined solvent.

The solvent for the ink may be any of, for example, cyclohexylbenzene (CHB), diethylbenzene, decahydronaphtalene, methylbenzoate, acetophenone, phenyl benzene, benzyl alcohol, tetrahydronaphtalene, isophorone, and n-dodecane, dicyclohexyl, p-xylene glycol dimethyl ether.

These solvents may used individually, and may also be used as a mixture of a plurality of solvents, and as a mixture with a low-boiling-point solvent.

However, given that, as described above, the film thickness is greatest in the hole transport layer 116R for red, is smaller in the hole transport layer 116G for green, and is smallest in the hole transport layer 116B for blue, the amount applied per unit surface area of the ink for the hole transport layer applied to each of the groove regions 125R, 125G, and 125B is also configured to decrease in this order (that is, the respective amounts applied per unit surface area of the groove regions 125R, 125G, and 125B Ia, Ib, and Ic have the relationship Ia>Ib>Ic).

Here, as indicated in FIG. 3, the banks 112 have a trapezoidal cross-sectional shape, and the width of the groove regions 125R, 125G, and 125B is wider at the aperture than at the base. Accordingly, the area of the groove regions 125R, 125G, and 125B is greater at the aperture than at the base. However, the "unit surface area" described above designates the unit surface area at the aperture portion (that is, the unit surface area for the area of the aperture portion obtained by multiplying the length of the groove regions in the Y direction by the aperture width of the groove regions 125R, 125G, and 125B indicated by the arrows in FIG. 2).

During the solvent application of FIG. 6A, the amount of solvent applied to each of the groove regions is configured to be least in the groove regions 125R, greater in the groove regions 125G, and greatest in the groove regions 125B (that is, the respective amounts of solvent applied per unit surface area Sa, Sb, and Sc for the aperture surface area of the groove regions 125R, 125G, and 125B have the relationship Sa<Sb<Sc).

Furthermore, the values of the respective amount of solvent applied Sa, Sb, and Sc are preferentially set such that the sum of the amount of ink and the amount of solvent applied per unit surface area in each of the groove regions 125R, 125G, and 125B is on the same level (that is, Ia+Sa≈Ib+Sb≈Ic+Sc).

As indicated in FIGS. 6A and 6B, the solvent need not be applied to the groove regions 125R, in which the amount of ink applied is greatest (that is, the configuration may be such that Sa=0).

Figure 6C:
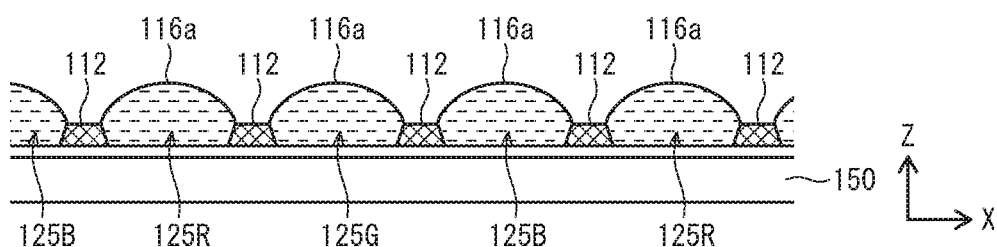

As such, the solvent and the ink applied to each of the groove regions 125R, 125G, and 125B are combined in the respective groove regions, and ink layers 116a are formed as indicated in FIG. 6C.

The composition of the solvent used in the process of applying the solvent preferentially includes a solvent component identical to the solvent contained in the ink, for better solvent compatibility between the ink and solvent, and for homogeneity of evaporation speed in the ink layers 116a among groove regions.

The bank substrate 150 on which the ink layers 116a are so formed is then dried. Drying of the ink layers 116a is preferentially performed as low-pressure drying in order to enable fast drying at a low temperature.

Figure 6D:
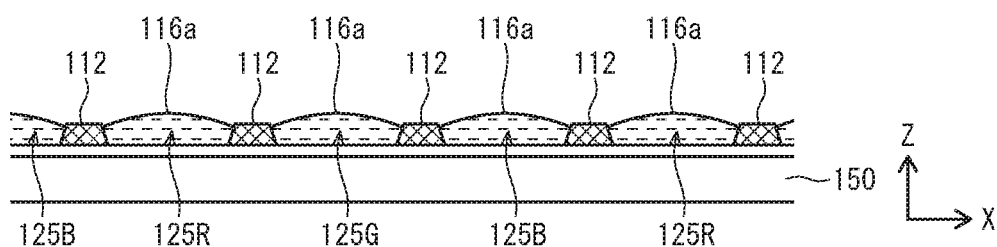
Figure 6E:
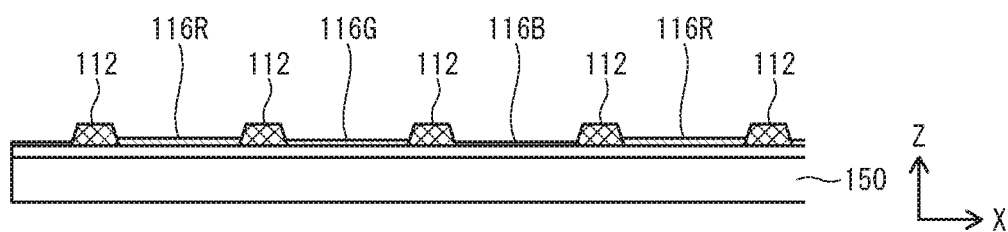

As drying proceeds, the volume of the ink layers 116a decreases as indicated in FIG. 6D. As indicated in FIG. 6E, the hole transport layers 116R, 116G, and 116B are formed in the groove regions 125R, 125G, and 125B after drying.

Immediately after application, the height of the ink layers 116a is, for example, in the order of a few tens of micrometers, but after drying, the film thickness of the hole transport layer 116 is a few tens of nanometers (e.g., 20 nm).

(Effects of Hole Transport Layer 116 Formation Process)

According to the above-described process of forming the hole transport layer 116, among the three types of groove regions 125R, 125G, and 125B making up the groove region groups 12, the groove regions 125R, in which the amount of ink applied per unit surface area is greater, are configured to have a smaller amount of solvent applied per unit surface area, in comparison to the remaining groove regions 125G and 125B.

Alternatively, this may be viewed as the groove regions 125R and 125G, in which the amount of ink applied per unit surface area is greater, being configured to have a smaller amount of solvent applied per unit surface area than the other groove regions 125B.

As a result, when the solvent and the ink have been applied to the groove regions 125R, 125G, and 125B, as indicated in FIG. 6C, variations in ink amount per unit surface area are reduced among the ink layers 116a formed in the groove regions 125R, 125G, and 125B.

Accordingly, as described below, bias in the film thickness distribution of hole transport layers 116R, 116G, and 116B formed in the groove regions 125R, 125G, and 125B may be prevented within the groove regions.

FIG. 7 is a diagram indicating a method of forming the hole transport layer 116 pertaining to a comparative example.

This comparative example differs from the method of forming the hole transport layer pertaining to Embodiment 1 as described above in that application of solvent to the groove regions 125R, 125G, and 125B is not performed.

Figure 7A:
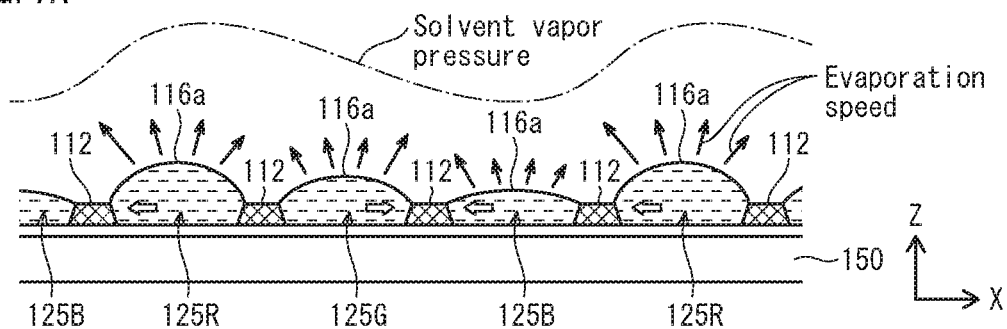
FIGS. 7A to 7D depict the manufacturing process of the hole transport layer 116 pertaining to a comparative example, FIG. 7A indicating the status immediately after ink application, FIG. 6B indicating the status immediately after hole transport layer 116B formation, FIG. 7C indicating the status immediately after hole transport layer 116G formation, and FIG. 7D indicating the status immediately after hole transport layer 116R formation.

In this situation, the respective amounts applied per unit surface area Ia, Ib, and Ic for the groove regions 125R, 125G, and 125B are used, as-is, as the amounts applied per unit surface area of the ink layers 116a that are formed. Accordingly, as indicated in FIG. 7A, the respective amounts applied per unit surface area Ia, Ib, and Ic of the ink layers 116a formed in the groove regions 125R, 125G, and 125B have the relationship Ia>Ib>Ic, and the surface area of the ink layers 116a per unit surface area of the groove regions also decreases in the stated order.

Upon drying the bank substrate 150 on which the ink has been so applied, an evaporation amount per unit surface area of the groove regions increases with greater surface area of the ink layers 116a per unit surface area of the groove regions. Thus, as indicated by the arrows of FIG. 7A, the evaporation amount per unit surface area of the groove regions is greatest in the groove regions 125R, smaller in the groove regions 125G, and smallest in the groove regions 125B. Therefore, a solvent vapor pressure formed over the substrate is also greatest in the groove regions 125R, smaller in the groove regions 125G, and smallest in the groove regions 125B.

Accordingly, in the respective ink layers 116a of the groove regions 125R, 125G, and 125B, the evaporation speed is greater in the groove regions where the solvent vapor pressure is smaller. Thus, as indicated by the outlined arrows, the ink flows toward groove regions having smaller solvent vapor pressure. Also, functional material in the ink layers is displaced along with the flow of ink, which causes bias in film thickness to occur among the hole transport layers 116R, 116G, and 116B.

Here, the relationship between volume, surface area, and evaporation speed of the ink layers 116a per unit surface area is considered.

Figure 8:
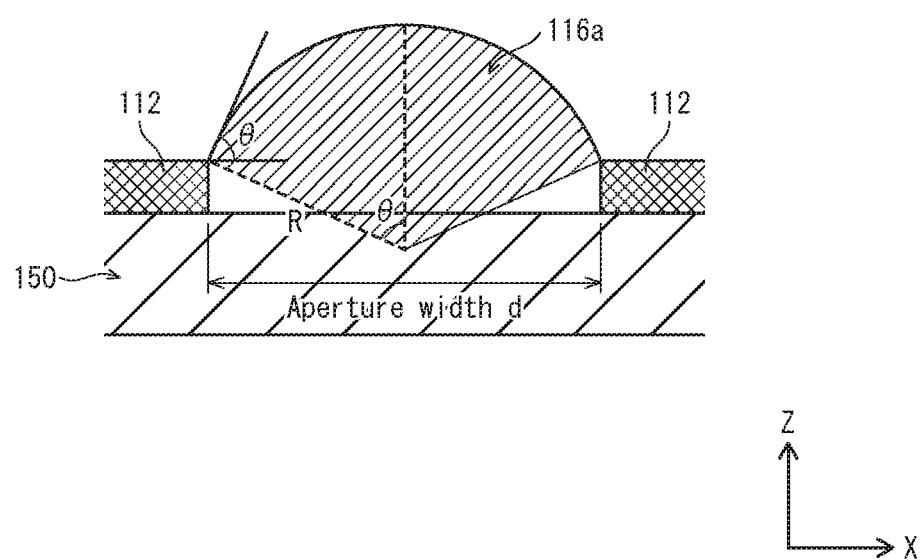
FIG. 8 is a schematic diagram indicating a cross-section of an ink layer 116a formed in a groove region between banks 112.

FIG. 8 is a schematic diagram depicting a cross-section of one of the ink layers 116a formed in one of the groove regions between the banks 112.

In FIG. 8, d represents aperture width of the one of the groove regions, and θ represents an angle with respect to the horizontal at a location where a surface of the ink layer 116a touches each of the banks 112. The surface of the ink layer 116a is taken to have an arc-like cross-section, and the ink layer 116a has length L in the Y direction, and as such, the surface area of the ink layer 116a is expressed as (Ldθ/sin θ). In addition, the surface area of the groove region in which the ink layer 116a is formed is expressed as dL. As such, the surface area of the ink layer 116a per unit surface area of the groove region is expressed as (θ/sin θ). In addition, the volume of the ink layer 116a is substantially equal to the volume of a cross-sectional wedge region indicated by diagonal hatching in FIG. 8, giving $(Ld^2\theta/4 \sin^2 \theta)$. In this situation, a ratio SN representing the relationship between the surface area S of the ink layer 116a per unit surface area of the groove region and the volume V per unit surface area of the groove region is S/V=4 sin θ/d.

Furthermore, when the aperture width d of the groove region is constant, then the angle θ with respect to the horizontal at the location where the surface of the ink layer 116a touches each of the banks 112 increases as the volume of the ink layer 116a in the groove region increases, and the surface area of the ink layer 116a also increases. Therefore, when the aperture width d of the groove region is constant, the surface area of the ink layer 116a may be increased by increasing the volume of the ink layer 116a.

Also, the surface area of the ink layer 116a per unit surface area of the groove region, the evaporation amount per unit surface area of the groove region, and the vapor density above, are thought to be substantially proportional. Therefore, homogenizing the surface area of the ink layer 116a per unit surface area of the groove region by increasing the volume of the ink layer 116a per unit surface area of the groove region serves to homogenize evaporation speed among the groove regions.

Furthermore, in the comparative example, bias in film thickness occurs in the ink layers 116 due to the different timing of drying completion for the ink layers 116a among the groove regions 125R, 125G, and 125B, as described below.

Figure 7B:
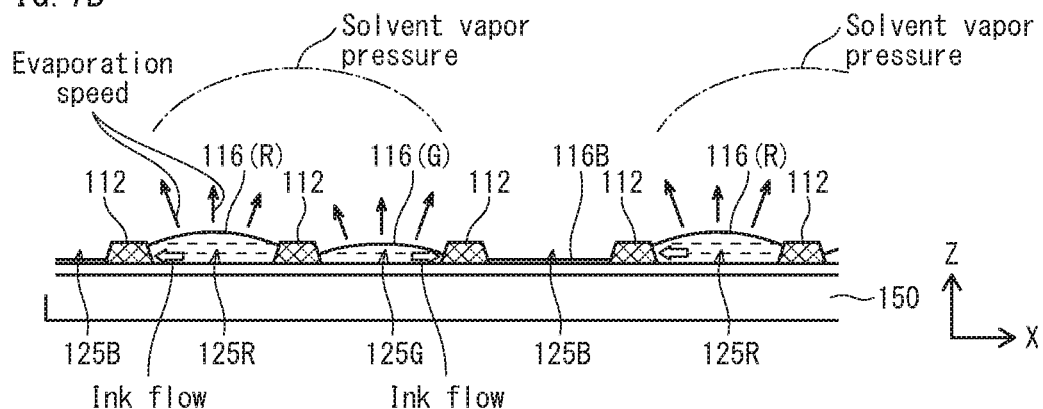

As indicated in FIG. 7B, once the ink layers 116a in the groove regions 125B have dried and the hole transport layers 116B are formed, the solvent evaporates from the groove regions 125R and 125G, but the solvent does not evaporate from the groove regions 125B. As such, the distribution of solvent vapor pressure over the bank substrate 150 is such that the vapor pressure is low over the groove regions 125B. As such, the evaporation speed of the solvent increases for the ink layer 116a over the groove regions 125R and for the ink layer 116a over the groove regions 125G at portions near the groove regions 125B (see the arrows in FIG. 7B). Also, the ink flows in the ink layers 116a as indicated by the white arrows in FIG. 7B.

Figure 7C:
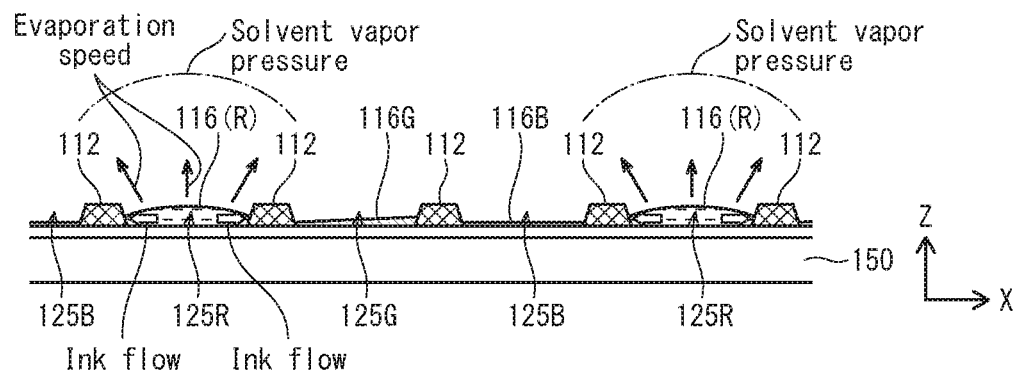

Furthermore, as drying progresses, the hole transport layer 116G is formed once the ink layer 116a dries in the groove regions 125G, as indicated in FIG. 7C. Then, the solvent evaporates from the groove regions 125R, but the solvent does not evaporate from the groove regions 125G and 125B. As such, the distribution of the solvent vapor pressure over the bank substrate 150 involves low vapor pressure over the groove regions 125G and 125B. The evaporation speed of the solvent increases for the ink layer 116a over the groove regions 125R at portions near the groove regions 125B and the groove regions 125G (see the arrows in FIG. 7C). Also, the ink flows in the ink layers 116a as indicated by the white arrows in FIG. 7C.

Figure 7D:
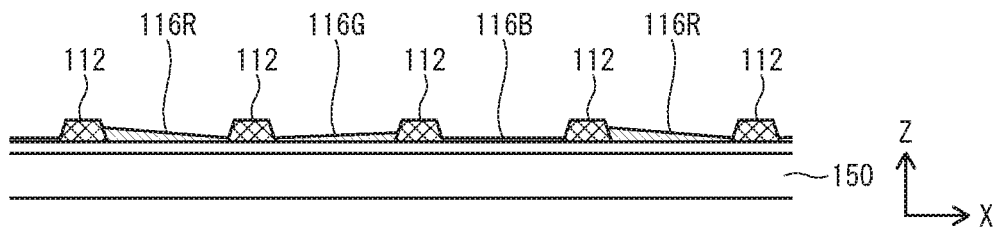

Finally, as indicated in FIG. 7D, the ink layer 116a in the groove regions 125R dries and the hole transport layer 116R is formed.

As such, in the method of manufacturing the hole transport layer 116 pertaining to the comparative example, a distribution of solvent vapor pressure over the substrate is produced and ink flow occurs in the ink layers 116a during drying. As a consequence, the film thickness distribution of the hole transport layer 116 formed in each of the groove regions 125 is biased, as indicated in FIG. 7D, for example.

Once bias occurs in the film thickness distribution of the hole transport layer 116 within each of the light emitting elements 11, situations may arise in which the wavelength of emitted light may not suit the film thickness in the resonator structure. Also, once bias in film thickness distribution occurs in the hole transport layer 116 within each the light emitting elements 11, current density increases at locations where the film thickness is smaller, which may cause rapid degradation of the light emitting elements 11.

In contrast, according to the method of forming the hole transport layer 116 of the above-described embodiment, the process of applying the solvent is provided. Thus, the ink layers 116a formed in each of the groove regions 125R, 125G, and 125B are homogenized in terms of ink amount per unit surface area, and are homogenized in terms of surface area of the ink layers per unit surface area of the groove regions, as indicated in FIG. 6C.

Accordingly, when drying, the vapor pressure over each of the groove regions 125R, 125G, and 125B is equal, and drying is completed at similar times. Thus, no bias occurs in the film thickness distribution of the hole transport layer 116 formed in each of the groove regions 125.

In other words, this method enables the film thickness of the hole transport layer 116 to be formed substantially homogeneously within each of the groove regions 125, which in turn enables the formation of the resonator structures suited to the wavelength of light emitted by the light emitting elements 11 in entirety.

In addition, the current density is also homogenized by the homogenization of the functional layer (hole transport layer 116) film thickness in the light emitting elements 11, thus producing the effect of longer useful life for the light emitting elements.

Specifically, in a situation where, as in the present embodiment, the film thickness configured for the hole transport layer 116 of each of the groove regions 125R, 125G, and 125B varies and the hole transport layer 116 is formed using a common ink, then differences in the amount of ink applied for each of the groove regions 125R, 125G, and 125B are unavoidable. However, applying the solvent as described above is highly worthwhile in that this approach enables the film distribution of the hole transport layer 116 within each of the light emitting elements 11 to be homogenized.

(Hole Transport Layer 116 Formation Process Variations)

In the above description of the hole transport layer 116, the solvent is first applied to each of the groove regions 125R, 125G, and 125B while the nozzle head 221 scans, and afterwards, the ink is applied to each of the groove regions 125R, 125G, and 125B while the nozzle head 222 scans. However, solvent application and ink application may also be performed on each of the groove regions 125R, 125G, and 125B in one scan of the nozzle head 221 and the nozzle head 222. Such a situation likewise produces the effect of eliminating bias in the film thickness of the hole transport layer 116 among the groove regions 125R, 125G, and 125B.

Also, in the above description, the solvent is applied before the ink is applied to each of the groove regions 125R, 125G, and 125B. However, this order may be reversed, and the solvent may be applied after the ink has been applied to each of the groove regions 125R, 125G, and 125B. Such a situation likewise produces the effect of eliminating bias in the film thickness of the hole transport layer 116 among the groove regions 125R, 125G, and 125B.

However, when the ink is applied to the groove regions 125R, 125G, and 125B first, there is a possibility that the ink may dry before the solvent is applied. However, this is not the case when the solvent is applied before the ink, as the ink and solvent applied to the groove regions are well mixed.

(Formation Process of Light Emitting Layer 117)

The light emitting layer 117 is formed by applying and drying ink for light emitting layer formation to the groove regions 125R, 125G, and 125B, in which the hole transport layer 116 has been formed, on the bank substrate 150.

The ink for light emitting layer formation is a solution in which material for the light emitting layer 117 has been dissolved in a solvent.

This ink is also applied by discharging the ink for light emitting layer formation to the groove regions 125R, 125G, and 125B while a nozzle head scans along the surface of the bank substrate 150. However, ink for red light emitting layer formation is applied to the groove regions 125R, ink for green light emitting layer formation is applied to the groove regions 125G, and ink for blue light emitting layer formation is applied to the groove regions 125B.

Then, the light emitting layer 117 is formed with the corresponding emission colors by drying the ink layers formed in each of the groove regions 125R, 125G, and 125B.

In the process of forming the light emitting layer 117, when there are differences in the amount of ink applied per unit surface area of the groove regions 125R, 125G, and 125B, effects of homogenizing the surface area of the ink layers per unit surface area of the groove regions and of homogenizing the film thickness distribution of the light emitting layer 117 among the groove regions 125R, 125G, and 125 are obtained by applying solvent one of before and after applying the ink, and homogenizing the total applied amount of the ink and the solvent per unit surface area of the groove regions 125R, 125G, and 125B, similarly to the process for forming the hole transport layer 116 described above.

Embodiment 2

Figure 9:
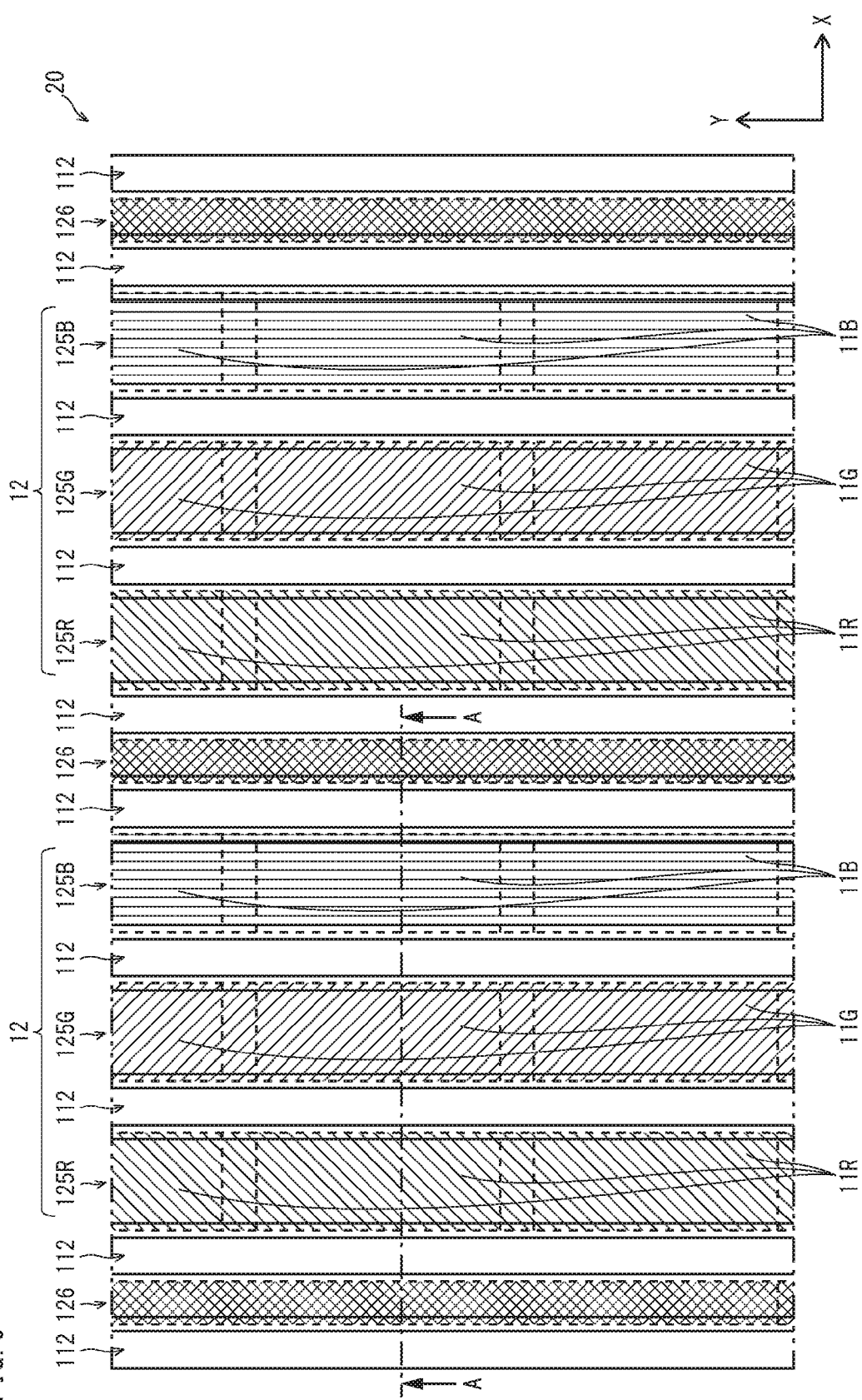
FIG. 9 is a schematic plan view diagram indicating an arrangement of light emitting elements 11a, 11b, and 11c in a display panel 20 pertaining to Embodiment 2.
Figure 10:
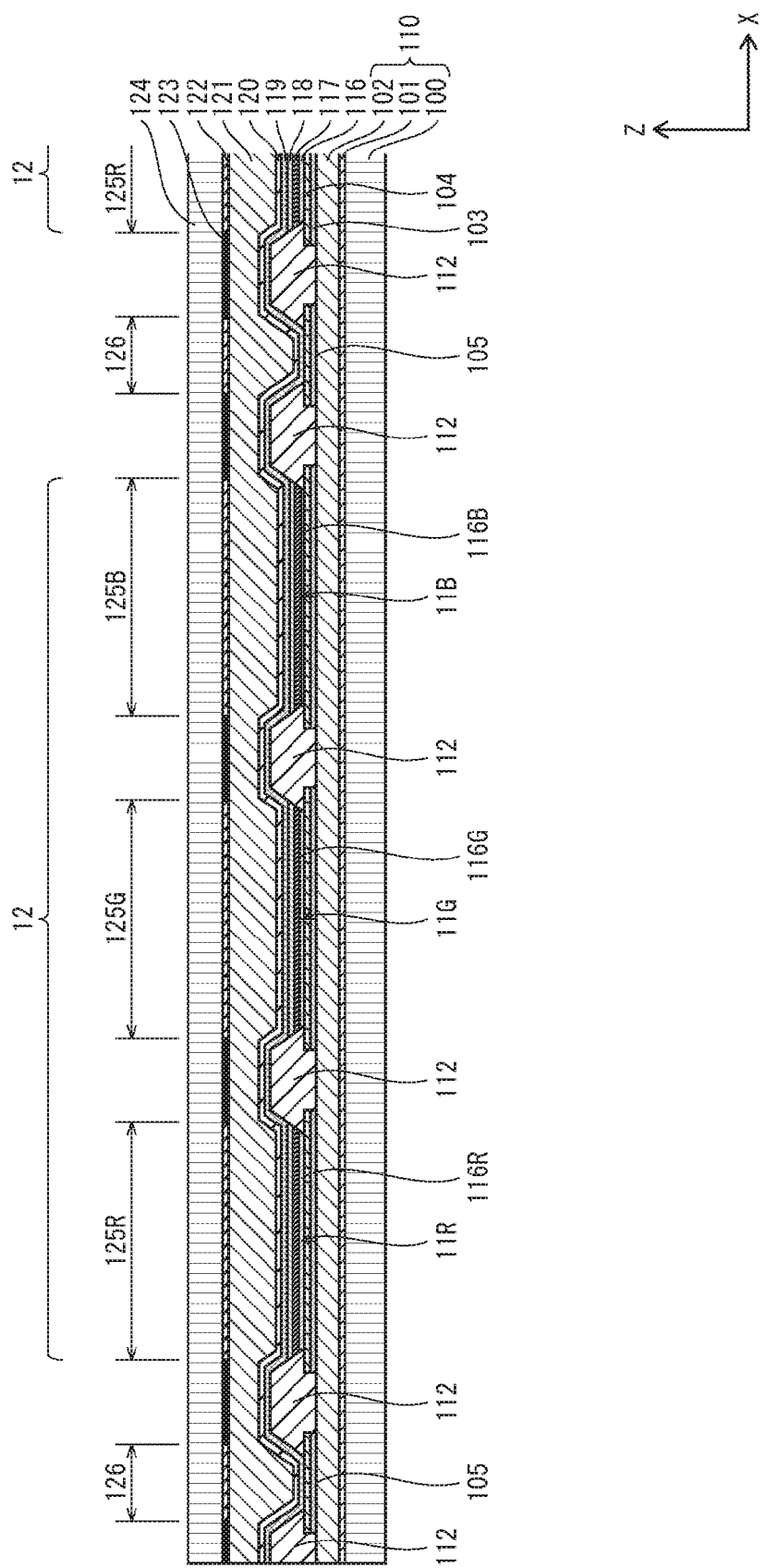
FIG. 10 is a schematic cross-sectional diagram indicating a cross-section along A-A in FIG. 9.

FIGS. 9 and 10 are diagrams depicting the structure of a display panel 20 pertaining to Embodiment 2.

The display panel 20 is similar in basic configuration to the display panel 10 pertaining to Embodiment 1 described above, but differs therefrom in that, on a substrate 110, a busbar region 126 is secured between the groove region groups 12 neighboring each other, and a busbar 105 is disposed extending in the Y direction.

The busbar 105 is formed from identical material to the pixel electrode 103 and in the same layer on the top face of the inter-layer insulation layer 102. A top face side of the busbar 105 is continuous in the Y direction, in contact with, and electrically connected to the cathode 119 via the hole injection layer 104.

As such, the cathode 119 is electrically connected to the busbar 105 along the Y direction and therefore electrical resistance in the Y direction is decreased.

A method of manufacturing the display panel 20 is similar to the method of manufacturing the display panel 10 described above in Embodiment 1, with the busbar 105 being formed simultaneously in the process of forming the pixel electrode 103.

FIGS. 11A to 11E are schematic cross-sectional diagrams indicating the process of forming the hole transport layer in the groove regions 125R, 125G, and 125B.

In the present embodiment, as described in Embodiment 1, in the process of forming the hole transport layer 116, the applied amount per unit surface area of the ink for the hole transport layer applied to each of the groove regions 125R, 125G, and 125B is also configured to be greatest in the groove regions 125R, smaller in the groove regions 125G, and smallest in the 125B, and only the solvent is applied to the groove regions 125G and 125B before the ink is applied. Then, as indicated in FIGS. 11A and 11B, the applied amount of the solvent per unit surface area in each the groove regions 125R, 125G, and 125B is configured to be smallest in the groove regions 125R, greater in the groove regions 125G, and greatest in the groove regions 125B, also similar to Embodiment 1.

Furthermore, in the present embodiment, the busbar region 126 is present between the groove region groups 12. As such, the solvent is also applied to the busbar region 126 when the solvent is applied to the groove regions 125G and 125B, as indicated in FIGS. 11A and 11B.

Here, the amount of solvent applied to the busbar region 126 is preferentially such that a surface area of a solvent layer per unit surface area of the busbar region is equal to the surface area of the ink layers 116a per unit surface area of the groove regions, and such that an angle with respect to the horizontal at a location where the surface of the solvent layer is in contact with each of the banks 112 is equivalent to the angle with respect to the horizontal at the location where one of the ink layers 116a is in contact with each of the banks 112 (the angle θ in FIG. 8).

Accordingly, in the present embodiment, the ink layers 116a are formed in each of the groove regions 125R, 125G, and 125B, and the solvent layer is formed in the busbar region 126, as indicated in FIGS. 11B and 11C, producing the effects described below.

In a situation where the ink layers 116a in each of the groove regions 125R, 125G, and 125B have dried without the solvent being in the busbar region 126, the solvent vapor pressure over the bank substrate 150 decreases over the busbar region 126. Therefore, at locations near the busbar region 126, the speed at which the solvent evaporates from the ink layers 116a over the groove regions 125G and the groove regions 125R increases due to the coffee stain effect, causing the ink to flow and leading to uneven film thickness distribution for the hole transport layer 116 that is formed.

In contrast, in the present embodiment, the ink layers 116a in each of the groove regions 125R, 125G, and 125B dry with the solvent being present in the busbar region 126, and as such, the ink layers 116a are dried with the solvent vapor pressure over the bank substrate 150 being distributed homogeneously.

Accordingly, during drying of the ink layers 116a, variations in solvent evaporation speed are suppressed across locations, and the ink is unlikely to flow, and therefore the hole transport layer 116 formed in the groove regions 125 has a homogeneous film thickness distribution.

Embodiment 3

Figure 12A:
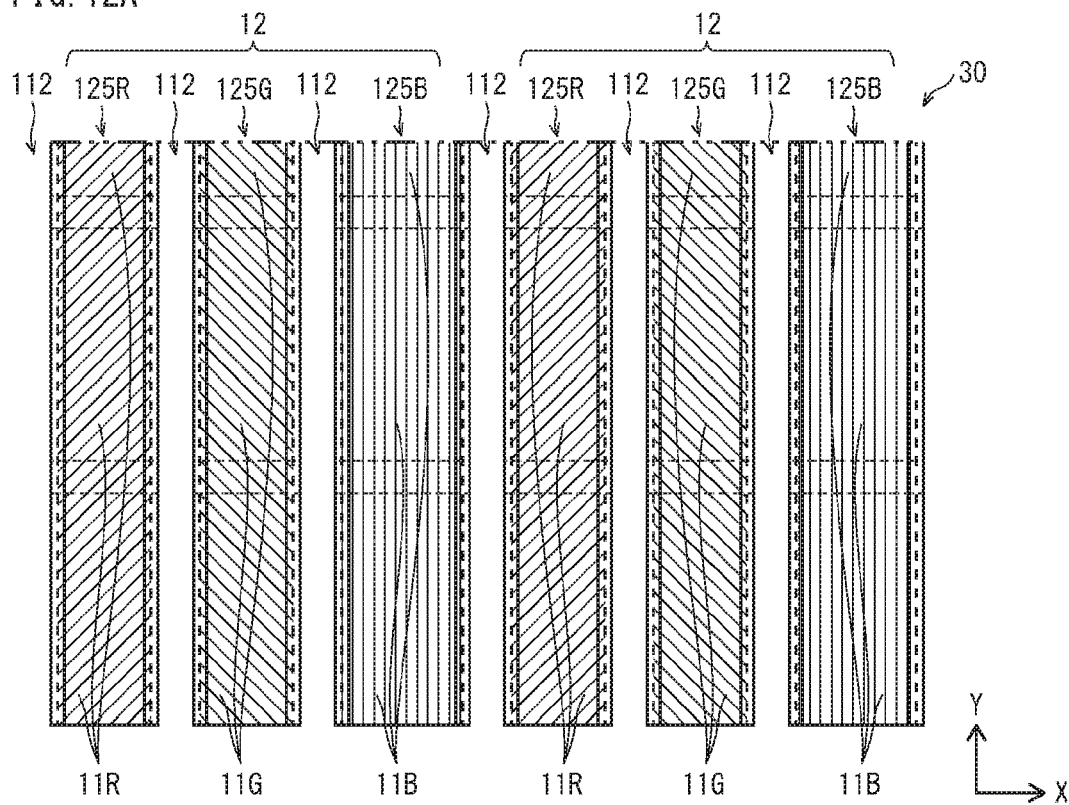
FIGS. 12A and 12B are plan view diagrams of a display panel 30 pertaining to Embodiment 3, FIG. 12A indicating an example in which the aperture width of groove regions for blue are wider, and FIG. 12B indicating an example in which a pixel bank is used.
Figure 12B:
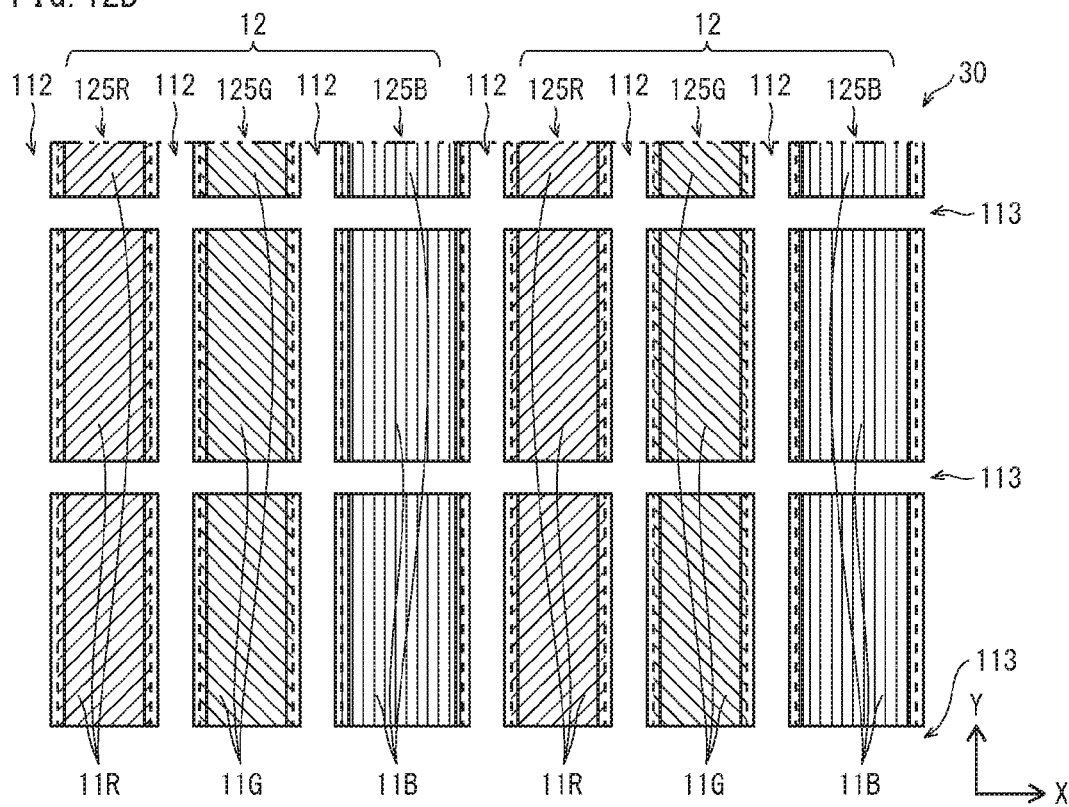

FIGS. 12A and 12B are plan view diagrams of a display panel 30 pertaining to Embodiment 3.

In the display panel 30, the light emitting elements 11B are configured to be wider in comparison to the light emitting elements 11R and 11G. In other words, the aperture width of the groove regions 125B for blue is wider in comparison to the groove regions 125R for red and the groove regions 125G for green. Typically, blue light emitting elements are more prone to degradation during driving in comparison with red light emitting elements and green light emitting elements. However, providing greater width in the light emitting elements 11B for blue enables the current density to remain small while the amount of emitted light is secured, thereby constraining degradation speed. In the display panel 30, the amount of ink for the hole transport layer applied per unit surface area to each of the groove regions 125R, 125G, and 125B is greatest in the groove regions 125R, smaller in the groove regions 125G, and smallest in the groove regions 125B. Also, before ink application, only the solvent is applied to each of the groove regions 125R, 125G, and 125B (however, the solvent need not be applied to the groove regions 125R). Here, the amount of solvent applied per unit surface area to the groove regions 125R, 125G, and 125B is smallest in the groove regions 125R, greater in the groove regions 125G, and greatest in the groove regions 125B.

Configuring the amount of solvent applied per unit surface area to each of the groove regions 125R, 125G, and 125B in this manner enables the volume and surface area of the ink layers 116a per surface area of the groove regions to be homogenized among the groove regions 125R, 125G, and 125B. Accordingly, during drying of the ink layers 116a in the groove regions 125R, 125G, and 125B, the solvent vapor pressure distribution over the substrate 110 is homogenized and ink is unlikely to flow within the groove regions. As such, the film thickness distribution of the hole transport layer 116 formed in each of the groove regions 125R, 125G, and 125B is also homogenized.

In addition, the amount of solvent applied to the groove regions 125R, 125G, and 125B is preferentially configured so that the surface area of the ink layers 116a formed in each of the groove regions 125R, 125G, and 125B per unit surface area of the groove regions is equal.

Here, in the present embodiment, the groove regions differ in aperture width. Specifically, as described above, the aperture width of the groove regions 125B is greater than the aperture width of the groove regions 125R and 125G. Also, in accordance with the relation of "the ratio S/V=4 sin θ/d" derived using FIG. 8 in Embodiment 1, when the volume of the ink layers 116a per unit surface area of the groove regions is constant among the groove regions 125R, 125G, and 125B, the ratio S/V between the surface area of the ink layers 116a per unit surface area of the groove regions and the volume of the ink layers 116a per unit surface area of the groove regions is smaller in the groove regions 125B than in the groove regions 125R and 125G. Accordingly, having the surface area S per unit surface area of the groove regions be equal among the groove regions 125R, 125G, and 125B may be achieved by configuring the amount of applied solvent so that the volume V of the ink layers 116a per unit surface area of the groove regions is greater in the groove regions 125B than in the groove regions 125R and 125G.

Also, the display panel 30 indicated in FIG. 12B is an example using a pixel bank.

In other words, a pixel bank is formed by the banks 112 extending in the Y direction and a plurality of banks 113 extending in the X direction intersecting each other. Also, regions surrounded by the banks 112 and the banks 113 serve as the groove regions 125R, 125G, and 125B, forming the light emitting elements 11R, 11G, and 11B.

When manufacturing the display panel 30, in which the width of the groove regions 125R, 125G, and 125B is not consistent, as described, using the method described above in Embodiment 1 for the process of forming the hole transport layer 116 also produces identical effects. In addition, identical effects may also be produced by likewise forming functional layers in the groove regions defined by the pixel bank, such as when creating the display panel 30 indicated in FIG. 12B.

[Modifications]

(1) In the above-described embodiments, examples are given in which each one of the groove region groups 12 is configured from three of the groove regions 125R, 125G, and 125B, the amount of ink applied per unit surface area differs among each of the three groove regions 125R, 125G, and 125B, and the amount of solvent applied per unit surface area also differs. However, the embodiments may also be realized in a situation where the amount of ink applied is identical for two of the groove regions 125R, 125G, and 125B and different for the remaining one of the groove regions.

Also, when the amount of ink applied per unit surface area differs among each of the three groove regions 125R, 125G, and 125B, the amount of solvent applied may be identical for two of the groove regions 125R, 125G, and 125B and different for the remaining one of the groove regions. In such a situation, although the surface area of the ink layers per unit surface area of the groove regions may not be equal among the three groove regions 125R, 125G, and 125B, the effect of a certain degree of homogenization is obtained. As such, the effect of eliminating bias in the film thickness of the hole transport layer 116 formed in each of the groove regions 125R, 125G, and 125B is realized.

(2) In the above-described embodiments, each one of the pixels is made up of three of the light emitting elements 11R, 11G, and 11B, and each one of the groove region groups 12 is made up of three of the groove regions 125R, 125G, and 125B. However, situations in which each one of the groove region groups is configured from two of the groove regions may also be realized, and the film thickness distribution of the hole transport layer formed in the groove regions is similarly homogenized.

(3) In addition, each one of the pixels may be configured from four or more of the light emitting elements 11R, 11G, and 11B, and each one of the groove region groups 12 may be configured from four or more of the groove regions. Such situations may be similarly realized and achieve similar effects.

(4) In the above-described embodiments, a situation has been described where the hole transport layer 116 and the light emitting layer 117 of the display panel 10 are formed by a wet process. However, the embodiments may be similarly realized in a situation where a functional layer other than the hole transport layer and the light emitting layer is formed by the wet process, such as when the hole injection layer, the electron transport layer, and the electron injection layer are formed by the wet process, and identical results may be obtained.

Furthermore, no limitation to an organic EL display panel is intended. For example, the embodiments may also be applied to formation of a functional layer in organic EL lighting, and identical results may be obtained.

(5) Among the groove region groups 12 formed over the base substrate, an average amount of the solvent applied per unit surface area in one of the groove region groups positioned at a peripheral portion of the base substrate may be greater than an average amount of the solvent applied per unit surface area in one of the groove region groups 12 positioned at a central portion of the base substrate.

In comparison to the one of the groove region groups 12 in the central portion of the base substrate, the one of the groove region groups 12 in the peripheral portion is prone to greater solvent evaporation speed. However, the time until drying of the ink layers is complete may be matched between the central portion and the peripheral portion by configuring the average amount of solvent applied per unit surface area in the one of the groove region groups 12 positioned at the peripheral portion of the base substrate to be greater than the average amount of solvent applied per unit surface area in the one of the groove region groups 12 positioned at the central portion of the base substrate, as described above. Adding this configuration imparts the effect of homogenizing the film thickness distribution of respective functional layers 116R, 1616G, and 116B formed in the groove regions 125R, 125G, and 125B.

(6) According to the above embodiments, an example is described of forming functional layers of a top-emission type of the display panel 10, but this can also be applied to forming functional layers of a bottom-emission type of display panel, achieving the same effects.

INDUSTRIAL APPLICABILITY

The method of forming functional layers pertaining to the present invention is applicable to manufacturing an organic light emitting device, such as an organic EL display device.

REFERENCE SIGNS LIST

1 Organic EL display device
10 Display panel
11R Red light emitting element
11G Green light emitting element
11B Blue light emitting element
12 Groove region group
20 Display panel
30 Display panel
100 Substrate
101 TFT layer
102 Inter-layer insulation layer
103 Pixel electrode
104 Hole injection layer
105 Busbar
110 Base substrate
112 Banks
113 Banks
116 Hole transport layer
116a Ink layer
117 Light emitting layer
118 Electron transport layer
119 Cathode
120 Sealing layer
121 Resin layer
104 Substrate
125R, 125G, 125B Groove regions 126 Busbar region
150 Bank substrate

The invention claimed is:

1. A method of forming a functional layer of an organic light-emitting device in which a plurality of pixels are disposed, each including a plurality of sub-pixels of different colors arranged next to one another, by a process including: preparing a bank substrate including a base substrate and a plurality of banks extending in one direction, parallel to each other, along a surface of the base substrate; applying ink to each of a plurality of groove regions between adjacent ones of the banks; and drying the ink after application, the method comprising:

defining a plurality of groove region groups on the bank substrate, each including a plurality of groove regions arranged next to one another for sub-pixels of different colors;

for each of the groove region groups, setting an amount of the ink per unit surface area applied to a subset of groove regions to be smaller than an amount of the ink per unit surface area applied to remaining groove regions in the groove region group;

before or after applying the ink to the groove regions, applying a solvent able to dissolve the ink to the subset of the groove regions, and either not applying the solvent or applying the solvent in a smaller amount per unit surface area than in the subset of the groove regions to the remaining groove regions; and drying ink layers formed in the groove regions by the application of the ink and the solvent.

2. The method according to claim 1, wherein an amount of the solvent applied to each of the groove regions is configured so that a surface area of the ink layer formed per unit surface area of the groove regions is equal.

3. The method according to claim 1, wherein a gap where a busbar is to be disposed is located between neighboring groove regions groups among the groove region groups on the base substrate, and during the application of the solvent, the solvent is also applied to the gap where the busbar is to be disposed.

4. The method according to claim 1, wherein, among the groove region groups, setting an average amount of the solvent applied per unit surface area to one of the groove region groups positioned at a peripheral portion of the base substrate to be greater than an average amount of the solvent applied per unit surface area to one of the groove region groups positioned at a central portion of the base substrate.

5. The method according to claim 1, wherein the application of the solvent is performed before the application of the ink in each of the groove regions.

6. The method according to claim 1, wherein the solvent includes a component shared with a solvent contained in the ink.

7. A method of manufacturing an organic light-emitting device formed by forming the functional layer on the base substrate, wherein the method according to claim 1 is used when forming the functional layer.

8. A device for manufacturing an organic light-emitting device, the organic light-emitting device including a bank substrate including: a base substrate and a plurality of banks extending in one direction, parallel to each other, along a surface of the base substrate, a plurality of groove regions each being located between adjacent ones of the banks and a plurality of groove regions groups being present, each including a plurality of groove regions arranged next to one another and sub-pixels of different colors, the device comprising:

a first inkjet head that discharges first liquid drops composed of an ink;

a second inkjet head that discharges second liquid drops composed of a solvent able to dissolve the ink; and a control unit that makes the first inkjet head discharge the first liquid drops into a subset of the groove regions in each of the groove region groups so an amount of ink applied per unit surface area is small in comparison to remaining groove regions, makes the second inkjet head discharge the second liquid drops into the subset of the groove regions, and performs one of: not making the second inkjet head discharge the second liquid drops to the remaining groove regions; and making the second inkjet head discharge the second liquid drops in a smaller amount applied per unit area than the amount applied per surface area to the subset of the groove regions.

* * * * *